(12) United States Patent
Ramvall et al.

(10) Patent No.: US 12,107,126 B2
(45) Date of Patent: Oct. 1, 2024

(54) STEEP SLOPED VERTICAL TUNNEL FIELD-EFFECT TRANSISTOR

(71) Applicant: Taiwan Semiconductor Manufacturing Co., Ltd., Hsinchu (TW)

(72) Inventors: Peter Ramvall, Hsinchu (TW); Matthias Passlack, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 17/747,947

(22) Filed: May 18, 2022

(65) Prior Publication Data

US 2022/0278203 A1    Sep. 1, 2022

Related U.S. Application Data

(60) Continuation of application No. 16/836,710, filed on Mar. 31, 2020, now Pat. No. 11,355,590, which is a division of application No. 15/983,998, filed on May 18, 2018, now Pat. No. 10,636,878.

(51) Int. Cl.
| | |
|---|---|
| *H01L 29/66* | (2006.01) |
| *H01L 21/02* | (2006.01) |
| *H01L 29/12* | (2006.01) |
| *H01L 29/15* | (2006.01) |
| *H01L 29/20* | (2006.01) |
| *H01L 29/78* | (2006.01) |

(52) U.S. Cl.
CPC ...... *H01L 29/122* (2013.01); *H01L 21/02389* (2013.01); *H01L 29/152* (2013.01); *H01L 29/2003* (2013.01); *H01L 29/66666* (2013.01); *H01L 29/7827* (2013.01)

(58) Field of Classification Search
None
See application file for complete search history.

(56) References Cited

U.S. PATENT DOCUMENTS

| | | |
|---|---|---|
| 9,236,267 B2 | 1/2016 | De et al. |
| 9,502,265 B1 | 11/2016 | Jiang et al. |
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |

(Continued)

OTHER PUBLICATIONS

Chen et al., "GaN nanowire fabricated by selective wet-etching of GaN micro truncated-pyramid," *Journal of Crystal Growth* 426:168-172, 2015.

(Continued)

*Primary Examiner* — Moin M Rahman
(74) *Attorney, Agent, or Firm* — Seed IP Law Group LLP

(57) ABSTRACT

The current disclosure describes a vertical tunnel FET device including a vertical P-I-N heterojunction structure of a P-doped nanowire gallium nitride source/drain, an intrinsic (Continued)

InN layer, and an N-doped nanowire gallium nitride source/drain. A high-K dielectric layer and a metal gate wrap around the intrinsic InN layer.

20 Claims, 7 Drawing Sheets

(56) References Cited

U.S. PATENT DOCUMENTS

| | | | |
|---|---|---|---|
| 2011/0108887 A1* | 5/2011 | Fareed | H01L 29/66462 |
| | | | 257/E21.403 |
| 2014/0203350 A1* | 7/2014 | Chuang | H01L 29/0676 |
| | | | 257/329 |
| 2016/0035941 A1* | 2/2016 | Herner | H01L 33/44 |
| | | | 257/13 |
| 2016/0268256 A1 | 9/2016 | Yang et al. | |
| 2016/0336324 A1 | 11/2016 | Li et al. | |
| 2017/0012125 A1 | 1/2017 | Le et al. | |
| 2017/0125521 A1 | 5/2017 | Fay et al. | |
| 2017/0125555 A1* | 5/2017 | Fay | H01L 29/0669 |
| 2018/0062040 A1 | 3/2018 | Simin et al. | |

OTHER PUBLICATIONS

Hiramatsu et al., "Fabrication and characterization of low defect density GaN using facet-controlled epitaxial lateral overgrowth (FACELO)," *Journal of Crystal Growth 221*:316-326, 2000.

Kim et al., "High-Brightness Light Emitting Diodes Using Dislocation-Free Indium Gallium Nitride/Gallium Nitride Multiquantum-Well Nanorod Arrays," *Nano Letters 4*(6):1059-1062, 2004.

Li et al., "III-N Heterojunctions for Tunnel Field-Effect Transistors," prepared Sep. 11, 2016, for the Steep Workshop at *ESSCIRC-ESSDERC 2016*, Lausanne, Switzerland, 13 pages.

Li et al., "Polarization-Engineered III-Nitride Heterojunction Tunnel Field-Effect Transistors," *IEEE Journal on Exploratory Solid-State Computational Devices and Components 1*:28-34, 2015.

Lundskog et al., "Controlled growth of hexagonal GaN pyramids by hot-wall MOCVD," *Journal of Crystal Growth 363*:287-293, 2013.

Terman, "An Investigation of Surface States at a Silicon/Silicon Oxide Interface Employing Metal-Oxide-Silicon Diodes," Solid State Electronics, vol. 5, pp. 285-299.

Yeh et al., "InGaN/GaN Multiple Quantum Wells Grown on Nonpolar Facets of Vertical GaN Nanorod Arrays," *Nano Letters 12*(6):3257-3262, 2012.

* cited by examiner

STEEP SLOPED VERTICAL TUNNEL FIELD-EFFECT TRANSISTOR

BACKGROUND

This disclosure relates generally to fabricating semiconductor structures, and in some embodiments, to a process for forming a vertical tunnel FET having GaN.

Metal-oxide-semiconductor (MOS) field-effect transistor (FET) has been a dominating technology for integrated circuits. A MOSFET can work in three regions, depending on gate voltage $V_g$ and source-drain voltage $V_{ds}$, linear, saturation, and sub-threshold regions. The sub-threshold region is a region wherein gate voltage $V_g$ is smaller than threshold voltage $V_t$. The sub-threshold swing represents the easiness of switching the transistor current off and is an important factor in determining the speed and power of a MOS device. The sub-threshold swing can be expressed as a function of $m*kT/q$, wherein m is a parameter related to capacitance. The sub-threshold swing of conventional MOS devices has a limit of about 60 mV/decade (kT/q) at room temperature, which in turn sets a limit for further scaling of operation voltage VDD and threshold voltage $V_t$. This limitation is due to the drift-diffusion transport mechanism of carriers. For this reason, existing MOS devices typically cannot switch faster than 60 mV/decade at room temperatures. The 60 mV/decade sub-threshold swing limit also applies to FinFET or ultra-thin body MOSFET on silicon-on-insulator (SOI) devices. Therefore, with better gate control over the channel, a newer ultra-thin body MOSFET on SOI or a finFET can achieve a sub-threshold swing close to, but not below, the limit of 60 mV/decade. With such a limitation, faster switching at low operation voltages for future nanometer devices is challenging to achieve.

The tunnel field-effect transistor (TFET) is a newer type of transistor. TFETs switch by modulating quantum tunneling through a barrier. Because of this, TFETs are not limited by the thermal Maxwell-Boltzmann tail of carriers, which limits MOSFET subthreshold swing to about 60 mV/decade of current at room temperature.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1:
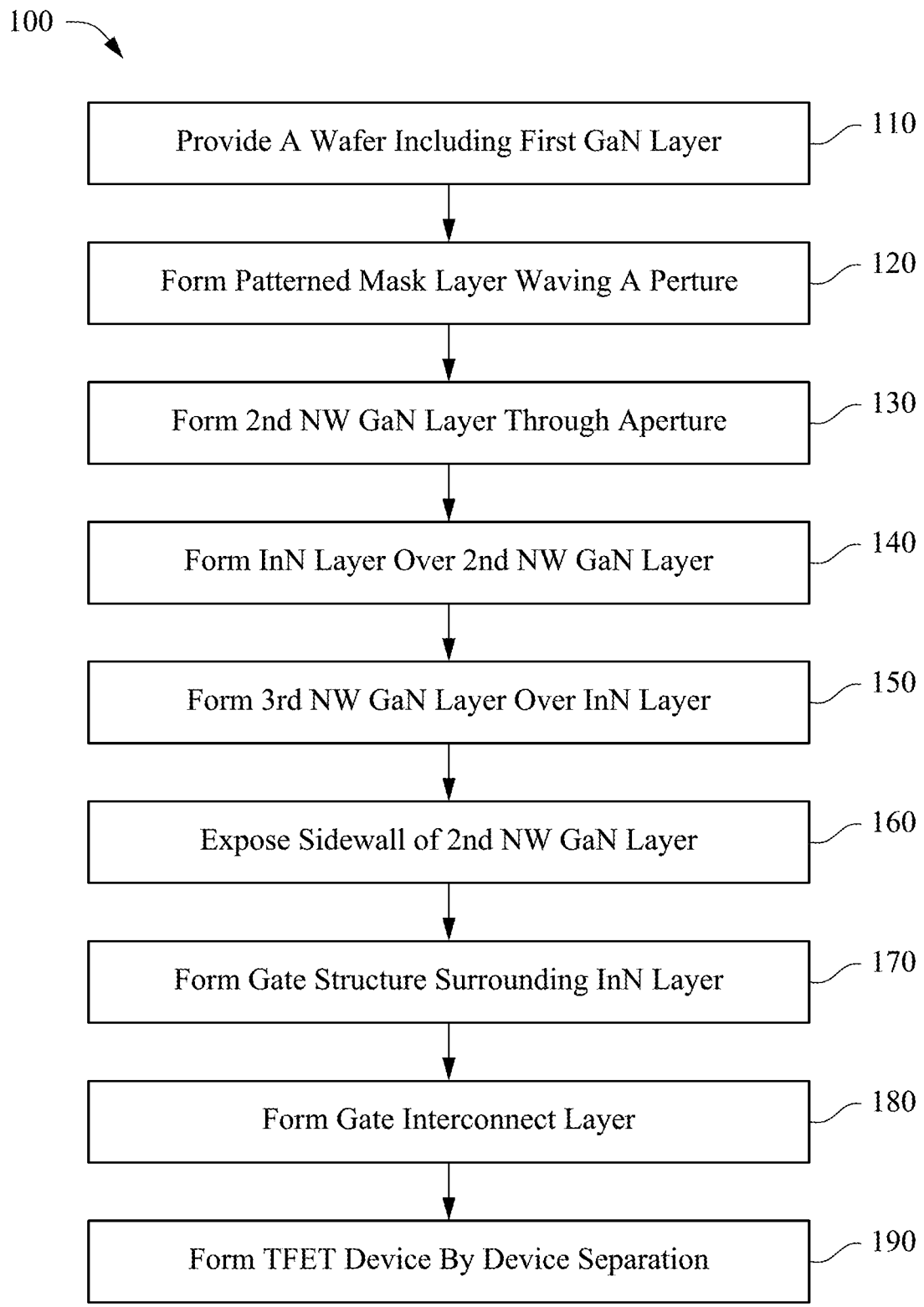
FIG. 1 illustrates an example process of making a vertical tunnel FET according to embodiments of the disclosure.

Techniques in accordance with embodiments described herein are directed to a novel process to fabricate a vertical tunnel field-effect transistor (TFET) with III-V compound semiconductor materials. In one or more embodiments of the current disclosure, an epitaxial gallium nitride GaN base layer (or "first GaN layer") is grown in the orientation of Ga polar over a substrate, e.g., by metalorganic chemical vapor deposition (MOCVD). The first GaN layer may be of three-dimensional nanostructure ("nanowire") or may be of other crystal structures. The GaN base layer is formed with P-type dopants/impurities, e.g., magnesium Mg, or N-type dopants/impurities, e.g., silicon Si or germanium Ge, using suitable doping processes. A mask layer of, e.g., silicon nitride or silicon carbide, is formed and patterned over the GaN base layer to define a selective area for forming the TFET.

A second layer of nanowire GaN is grown over the first GaN layer. The second nanowire GaN layer is formed with P-type dopants/impurities, e.g., magnesium Mg, or N-type dopants/impurities, e.g., silicon Si or germanium Ge, using suitable doping processes. With variable controls of the growth conditions, e.g., temperature and pressure, the second layer of nanowire GaN includes an upper portion profile ranging from a substantially flat/planar surface to a pointed pyramid shape having six sloped crystal facets each having a shape of an acute triangle. In an example embodiment, the upper portion of the second nanowire GaN layer may be tapered and include a substantially flat top surface, i.e., the (0001) crystal facet of GaN grown in the Ga polar, surrounded by six sloped crystal facets, i.e., the (1-101) crystal facets or semi-polar crystal facets of GaN grown in the Ga polar. Each of the six semi-polar crystal facets may have a shape of an acute trapezoid. An angle between the sloped (1-101) crystal facet and the flat (0001) crystal facet is in a range of about 100 degree to about 155 degree. In an example, the angle is 118 degree (or 62 degree). A height or thickness of the second layer of nanowire GaN is within a range between about 20 nm to about 100 nm. The second nanowire GaN layer is formed with a same type of impurity as the first nanowire GaN layer. For example, in a case that the first nanowire GaN layer is doped as N-type with silicon Si or germanium Ge as the impurities, the second nanowire GaN layer is also formed with N-type impurities, e.g., Si or Ge.

In an embodiment, all the GaN layers are grown in the orientation of the Ga polar with a height or thickness of about 20 nm to about 100 nm.

In accordance with various embodiments of the present disclosure, a thin layer of another III-V semiconductor material, e.g., a thin layer of indium nitride InN or indium gallium nitride InGaN, is formed as an epitaxial film over the first nanowire GaN layer. The InN facilitates band-to-band tunneling (BTBT) effects by modifying the GaN/InN/GaN bandstructure line-up by the built-in spontaneous and piezo-electric polarization fields. The presence of Ga in the InN may facilitate the bonding between the InN or InGaN to the GaN. Also Ga atoms may be an unavoidable impurity in the growth of InN on top of GaN. The layer of one or more of InN or InGaN may be formed with a thickness ranging between about 1.5 nm to about 4 nm. In an embodiment, the layer of one or more of InN or InGaN has a thickness of about 2 nm.

The layer of one or more of InN or InGaN, hereinafter "InN layer" is formed to follow the profile of the second nanowire GaN layer. For example, the InN layer is formed on the sidewall(s) of the second nanowire GaN layer and on top of the semi-polar (1-101) crystal facets and the top Ga polar (0001) crystal facet.

In accordance with various embodiments described herein, the InN layer is not doped, namely intrinsic. In other embodiments, the InN layer may be lightly doped.

A third layer of nanowire GaN is formed over the InN layer in accordance with various embodiments described herein. In an embodiment, the forming conditions of the third layer nanowire GaN is controlled such that the upper portion thereof include a substantially flat surface in the Ga polar orientation, i.e., the polar crystal facet or (0001) crystal facet. The size, e.g., distance between opposite sides of the upper polar crystal facet or the diameter of the upper polar crystal facet may be determined based on the expected diameter or size of the TFET device made from the vertical heterojunction structure. In another example, the size of the upper flat surface, i.e., Ga polar facet, of the third nanowire GaN layer at least partially overlaps the sloped surfaces, semi-polar facets, of the second nanowire GaN layer. In various embodiments, the third nanowire GaN layer is formed with a different type of doping impurity from that of the second nanowire GaN layer. For example, in the case that the second nanowire GaN layer is doped as N-type with Si or Ge impurities, the third nanowire GaN layer is doped as P-type with Mg impurity. The third layer of nanowire GaN has a height or thickness of about 20 nm to about 100 nm.

In accordance with various embodiments of the present description, a selective etching is conducted to remove side portion(s) of the third nanowire GaN layer and side portion(s) of the InN layer to an extent that a sidewall of the second nanowire GaN layer is etched and exposed. That is, a side portion of the second nanowire GaN may also be removed to provide an exposed sidewall of the second nanowire GaN layer. In an embodiment, after the selective etching, the third nanowire GaN layer includes only a substantially flat upper surface, i.e., Ga polar facet, on the upper portion and does not include a sloped semi-polar crystal facet (1-101) on the upper portion.

In accordance with various embodiments of the present description, a gate structure is formed surrounding the intrinsic InN layer. The gate structure may include a metal gate and a gate dielectric layer.

A vertical TFET device, in accordance with various embodiments described herein, thus includes a substrate, a first GaN layer, a second nanowire GaN layer grown over a selective area of the first GaN layer, an InN layer over the second nanowire GaN layer and a third nanowire GaN layer over the InN layer. The first GaN layer and the second nanowire GaN layer are doped as a same type of semiconductor and the third nanowire GaN layer is doped as a different type of semiconductor, other than the second nanowire GaN layer.

The second and third nanowire GaN layers are configured as source/drain regions, and a gate structure wraps around the InN layer and at least partially the second and third nanowire GaN layers.

In an example, an upper portion of the second nanowire GaN layer includes a sloped surface having a shape of either an acute triangle or an acute trapezoid. The InN layer follows the upper portion profile of the second nanowire GaN layer and includes a sloped portion. An angle between the sloped portion of the InN layer and a sidewall of the second nanowire GaN layer is obtuse and in accordance with various embodiments, is in a range of about 100 to about 155 degrees.

As the channel region of InN includes a sloped segment, which is closer to the wrap-around gate than a flat channel region in the polar crystal facet of GaN, the electrostatic gate control is improved. Further, the sloped segments of the InN layer also increase the area that the InN layer interfaces with the second nanowire GaN layer and the third nanowire GaN layer, which affects the tunneling current. As such the tunneling current of the channel region is increased.

The disclosure herein provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The following description refers to a transistor as an example of a semiconductor structure to which the present description applies; however, the present description is not limited in applicability to transistors. For example, the follow description applies to other types of semiconductor structures that are not transistors where the improved tunneling effects of the intrinsic channel region are desirable in a vertical device using GaN. Further, the disclosure also including a vertical device using other III-V materials, which include a pyramid type upper profile, i.e., a sloped surface.

FIG. 1 illustrates an example fabrication process 100 of making a vertical TFET having nanowire GaN as source/drain regions in accordance with various embodiments disclosed herein. As used herein, consistent with the accepted definition within solid state material art, a "nanowire" refers to a three-dimensional crystal structure of GaN. A nanowire GaN may be grown in the gallium Ga face orientation, i.e., the top crystal facet is Ga atoms or may be grown in the nitrogen N-face orientation, i.e., the top crystal facet is N atoms. In the description herein, nanowire GaN grown in the Ga polar orientation is used as an illustrative example, which does not limit the scope the disclosure.

Figure 2A:
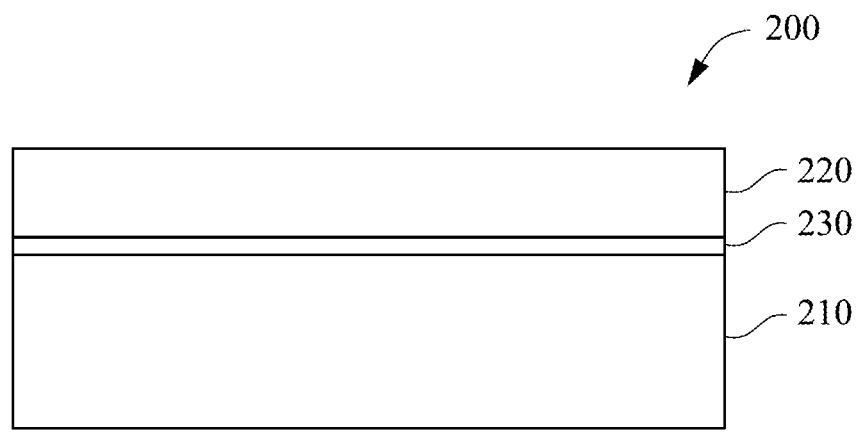
FIGS. 2A-2M illustrate various views of an example wafer at various stages of fabrication according to embodiments of the disclosure.

Referring to FIG. 1, with reference also to FIG. 2A, in example process 110, a wafer 200 is provided. Wafer 200 includes a substrate 120 and a GaN layer 220 (hereinafter "first GaN layer") formed over substrate 210. Substrate 210 may be a silicon substrate in a crystalline structure, e.g., the Si(111) or Si(001) crystalline structures, and/or other elementary semiconductors like germanium. Alternatively or additionally, substrate 210 may include a compound semiconductor such as silicon carbide, gallium arsenide, indium arsenide, sapphire, and/or indium phosphide. Further, substrate 220 may also include a silicon-on-insulator (SOI) structure. Substrate 210 may include an epitaxial layer and/or may be strained for performance enhancement. Substrate 120 may also include various doping configurations depending on design requirements as is known in the art such as p-type substrate and/or n-type substrate and various doped regions such as p-wells and/or n-wells.

In an example, wafer 200 also includes a layer 230 of aluminum nitride AlN between substrate 210 and first nanowire GaN layer 220. AlN layer 230 functions, among others, to improve the GaN nucleation over substrate 210.

The thickness of first GaN layer 220 is selected based on device design and structural strength considerations, e.g., aspect ratio. To provide a solid base for the subsequent nanowire GaN growth over first nanowire GaN layer 220, first nanowire GaN layer 220 is sufficiently thick to provide low dislocation density, e.g., smaller than $10^8$ cm$^{-2}$. In an embodiment, the thickness of first GaN layer 220 is within a range of about 50 nm to about 200 nm.

The first GaN layer 220 may be formed on substrate 210 or AlN layer 230 using metalorganic chemical vapor deposition (MOCVD) or molecular beam epitaxy (MBE).

First GaN layer 220 may be doped as N-type, e.g., by supply of additional Si or Ge containing precursor, or may be doped as P-type, e.g., by using Mg precursor. Other suitable doping procedures, e.g., ion implantation of Si, Ge impurities for N-type or Mg impurities for P-type, are also possible and included in the disclosure. For illustrative purposes, first the GaN layer 220 is formed with P-type impurity.

For illustrative example, first GaN layer 220 is formed in the orientation of Ga polar.

Figure 2B:
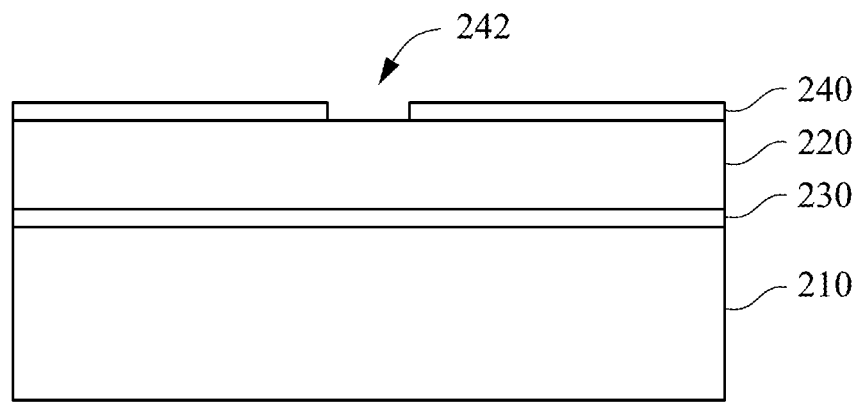

In example operation 120, with reference also to FIG. 2B, a mask layer (also called template layer) 240 of dielectric, e.g., silicon nitride or silicondioxide, is formed over first GaN layer 220 and patterned to have an aperture 242 that exposes first GaN layer 220 therethrough. The mask layer 240 serves, among others, the purposes of selective area growth of GaN through aperture 242. Other selective area growth techniques, e.g., by using a template hard mask, is also possible and included in the disclosure.

Figure 2C:
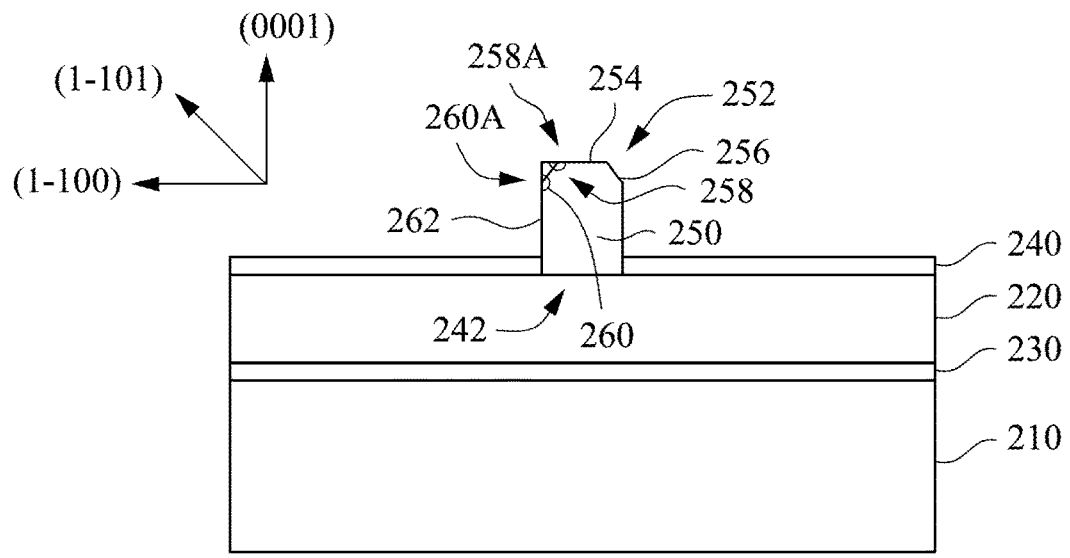

In example operation 130, with reference also to FIG. 2C, a second nanowire GaN layer 250 is formed in the Ga polar orientation over first GaN layer 220 and extends upwards through aperture 242. In an example, second nanowire GaN layer 250 is grown under the bottom up and selective area growth (SAG) approaches using MOCVD, vapor-phase epitaxy and/or crystal facet-controlled epitaxial lateral overgrowth (FACELO) techniques or other suitable growth mechanisms.

Facet control techniques are used to control the profile of an upper portion 252 of second nanowire GaN layer 250. For example, the material of the mask layer 240, the mask fill factor of mask layer 240, the size and shape of aperture 242, the growth temperature for second nanowire GaN layer 250, the reactor pressure, the flow rate of Ga source and NH$_3$, and the doping impurity all may be controlled to achieve different upper crystal facets of resulting second nanowire GaN layer. With crystal facet control techniques used in the formation of second nanowire GaN layer 250, the profile of upper portion 252 may be controlled based on expected TFET device parameters. In an example, as shown in FIG. 2C, upper portion 252 is tapered and includes a top surface 254 which is substantially flat, e.g., parallel with a top surface of the GaN layer 220, and multiple sloped surfaces 256 that surround the top surface 254. An angle 258 between a sloped surface 256 and flat surface 254 is in a range between about 115 degree to about 145 degree (or about 35 degree to 65 degree for the corresponding acute angle 258A). In an example, angle 258A is about 62 degree. An angle 260 between sloped surface 256 and a side wall 262 of second nanowire GaN layer 250 is within a range between about 125 degree to about 155 degree (or between about 25 degree to about 55 degree for the corresponding acute angle 260A).

Figures 2D, 2E:
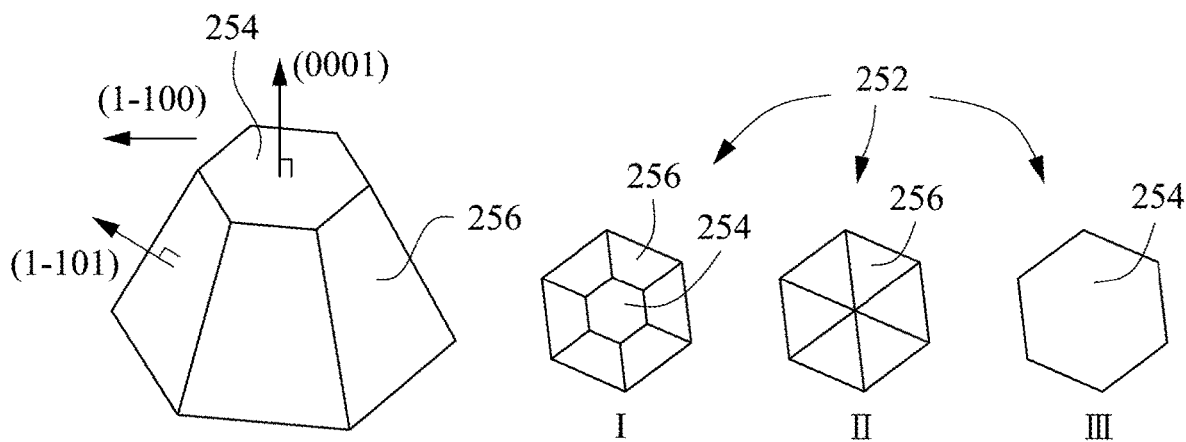

FIG. 2D illustrates a perspective view of upper portion 252. As shown in FIG. 2D, with reference also to FIG. 2C, top surface 254 is a crystal facet of Ga atoms formed in the Ga polar orientation. That is, top surface 254 is substantially perpendicular to the Ga polar direction (0001) and is called the Ga polar crystal facet or the (0001) crystal facet. Sloped surface 256 is perpendicular to a semi-polar orientation (1-101) and is called semi-polar crystal facet or (1-101) crystal facet of the nanowire GaN grown in the Ga polar. FIG. 2D also shows a non-polar orientation (1-100), which is substantially in parallel with top surface 254. Sidewall 262 is substantially perpendicular to the non-polar orientation, i.e., and is called a non-polar facet.

Figure 2F:
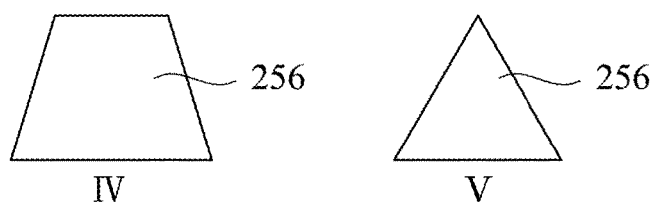

With various growth conditions in crystal facet control, the size of top surface 254 and the sizes of the surrounding sloped surfaces 256 may be varied. FIG. 2E shows three example upper portion 252 profiles I, II, and III from top view. Example I of upper portion 252 corresponds to that of FIG. 2D, where upper portion 252 includes top surface 254 surrounded by six sloped surface 256. Top surface 254 is substantially of a shape of a hexagon. Each sloped surface 256 is substantially of a shape of an acute trapezoid, as example trapezoid shape IV shown in FIG. 2F.

In another example, profile II, the size of top surface 254 is controlled to be substantially minimized and upper portion 252 is substantially of a shape of a pyramid. Six sloped surfaces 256 are each substantially of a shape of an acute triangle, as example acute triangle V shown in FIG. 2F.

In still another example, profile III, top surface 254 substantially overlaps the whole upper portion 252 and sloped surfaces 256 are substantially minimized.

As should be appreciated, the growth conditions of second nanowire GaN layer 250 may not be perfectly controlled and the profile of upper portion 252 may not be symmetric and may include irregularities. For example, the top surface 254 may not be a perfect hexagon in embodiment I of FIG. 2E. Further, it may be possible that some of the six sloped surfaces 256 have a substantially acute trapezoid shape and others of the six sloped surfaces 256 have a substantially acute triangle shape. Such irregularities and imperfections in the nanowire GaN growth are possible and included in this disclosure.

In the description herein, second nanowire GaN layer 250 having an upper portion 252 with a profile shown in FIGS. 2C and 2D is used as an illustrative example.

Second nanowire GaN layer 250 is formed with a same type of doping impurity as first GaN layer 220, here for example, P-type doping impurity.

Figure 2G:
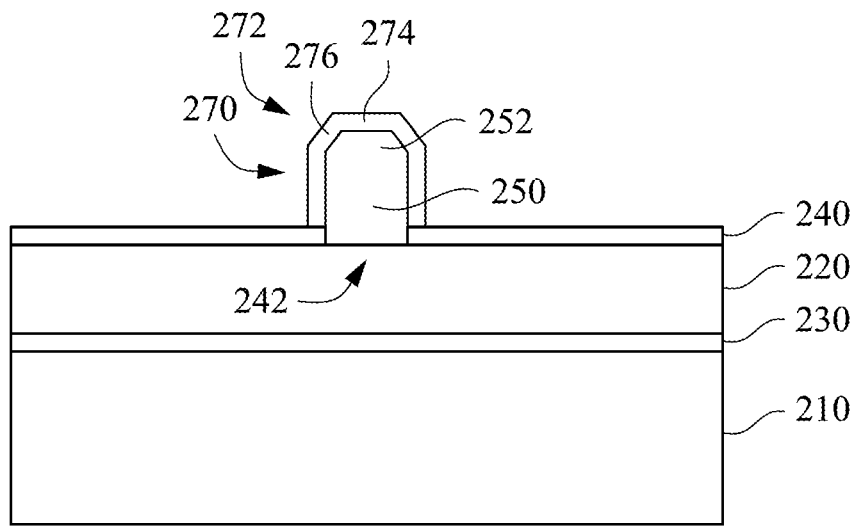

Referring back to FIG. 1, with reference also to FIG. 2G, in example operation 140, a layer 270 of one or more of InN or InGaN ("InN layer) is formed over second nanowire GaN layer 250. InN facilitates band-to-band tunneling (BTBT) effects by modifying the GaN/InN/GaN bandstructure line-up by the built-in spontaneous and piezo-electric polarization fields. The presence of Ga in the InN may facilitate the bonding between the InN or InGaN to the GaN. Also Ga atoms may be an unavoidable impurity in the growth of InN on top of GaN.

The InN and/or InGaN thin films may be grown by MOCVD or MBE.

The composition of layer 270 is $In_xGa_{1-x}N$. The ratio "x" of indium is between about 10% to about 100%. In some design scenarios, an increased ratio of indium among indium and gallium is desirable.

In an embodiment, InN layer 270 includes an upper portion 272 that substantially follows the upper portion 252 of second nanowire GaN layer 250. Specifically, in the case that upper portion 252 of second nanowire GaN layer 250 includes a substantially flat top surface 254 and six sloped surfaces 256, upper portion 272 of InN layer 270 also includes a substantially flat top segment 274 and six sloped segments 276. Dependent on the profile of upper portion 252 of second nanowire GaN layer 250, sloped segment 276 may be of a shape of an acute trapezoid or an acute triangle.

In an embodiment, InN layer 270 has a thickness ranging between about 1.5 nm to about 4 nm.

In an embodiment InN layer 270 is intrinsic, i.e., undoped. In other embodiments InN layer 270 is lightly doped.

Other materials, e.g., another III-V compound, are possible to substitute for InN in layer 270. The layer 270 material is selected based on the characteristics thereof to facilitate band-to-band tunneling (BTBT) effects by modifying the GaN/layer 270/GaN bandstructure line-up by the built-in spontaneous and piezo-electric polarization fields.

The presence of Ga in the InN substitute may facilitate the bonding between the InN or InGaN substitute to the GaN. Also Ga atoms may be an unavoidable impurity in the growth of InN substitute on top of GaN.

Figure 2H:
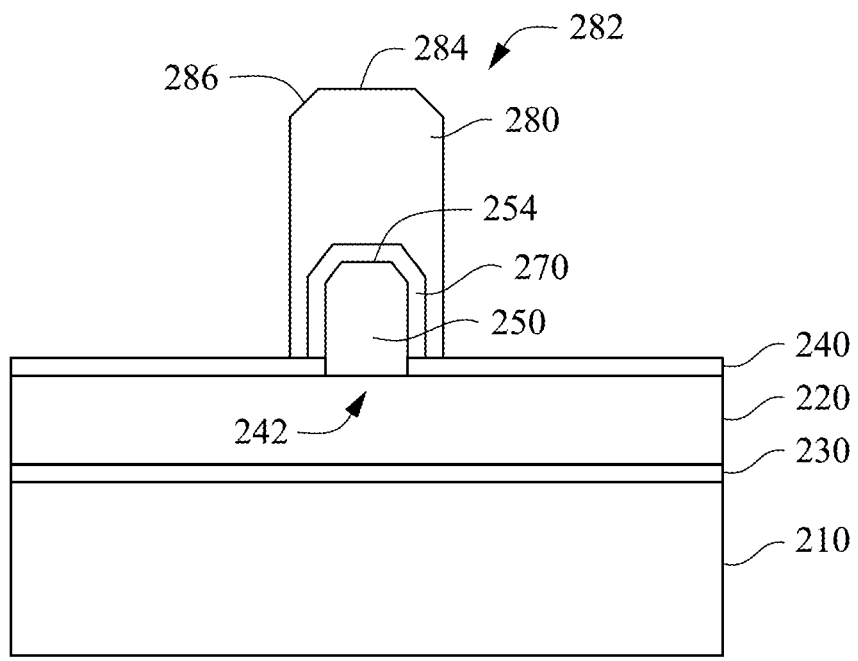

In example operation 150, with reference also to FIG. 2H, a third nanowire GaN layer 280 is formed over InN layer 270 using, e.g., selective area growth, and with same or similar GaN nanowire growth techniques as second nanowire GaN layer 250. In an embodiment, third nanowire GaN layer 280 includes an upper portion 282 that includes a substantially flat top surface 284 surrounded by six sloped surfaces 286. Top surface 284 at least partially overlaps or overlies sloped segment 276 of InN layer 270 and sloped surface 256 of second nanowire GaN layer 250.

In one embodiment, third nanowire GaN layer 280 is formed with a doping impurity of a different electric conductivity type from those of first and second nanowire GaN layers 220, 250. In the illustrative case that the first and second nanowire GaN layers 220, 250 are doped as P-type semiconductor, and third nanowire GaN layer 280 is doped as N-type semiconductor.

In various embodiments, third nanowire GaN layer 280 includes a height or thickness ranging from about 20 nm to 100 nm over InN layer 270.

Figure 2I:
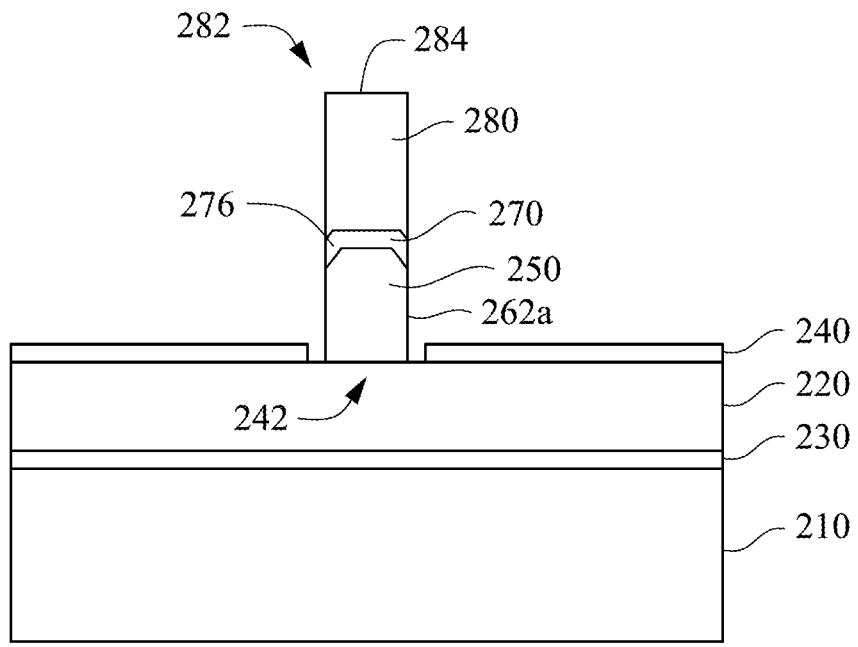

In example operation 160, with reference also to FIG. 2I, a side portion of third nanowire GaN layer 280 and a side portion of InN layer 270 are removed such that a sidewall 262A of second nanowire GaN layer 250 is exposed. Side wall 262A may be the original sidewall 262 of second nanowire GaN layer 250 when formed or may be a new sidewall in the non-polar orientation, i.e., the (1-100) crystal facet. That is, in example operation 160, a side portion of second nanowire GaN layer 250 may also be removed. The side portion removal may be implemented through a selective etch process, for example by KOH solution. Another etching example is, a photo-electrochemical (PEC) treatment and a post-processing wet etch to remove the side portions. The PEC treatment converts the side portions to oxide. The oxide portions (side portions) are then removed by wet etching in buffered hydrofluoric acid (HF) and post-etch immersion in potassium hydroxide (KOH) (0.5 M) at about 150° C. Other suitable approaches to selectively remove side portions of third nanowire GaN layer 280, InN layer 270 or second nanowire GaN layer 250 are also possible and included in this disclosure.

In an embodiment, the portion of InN layer 270 remaining after operation 160 includes at least a portion of sloped segments 276. In a further embodiment, the remaining third nanowire GaN layer 280 include only flat top surface 284 in the upper portion 282 and does not include any portion of a sloped surface (286 in FIG. 2H). That is, sloped surfaces 286 are removed. As such, the diameter of the P-I-N heterojunction structure is dependent on the size of top surface 284 of third nanowire GaN layer 280. The growth conditions of third nanowire GaN layer 280 are controlled to achieve the desired size of top surface 284. In an embodiment, to make sure that a sloped segment 276 of InN layer 270 remains in the P-I-N heterojunction structure, the size of top surface 284 of third nanowire GaN layer 280 is larger than the size of top surface 254 of second nanowire GaN layer 250.

Figure 2J:
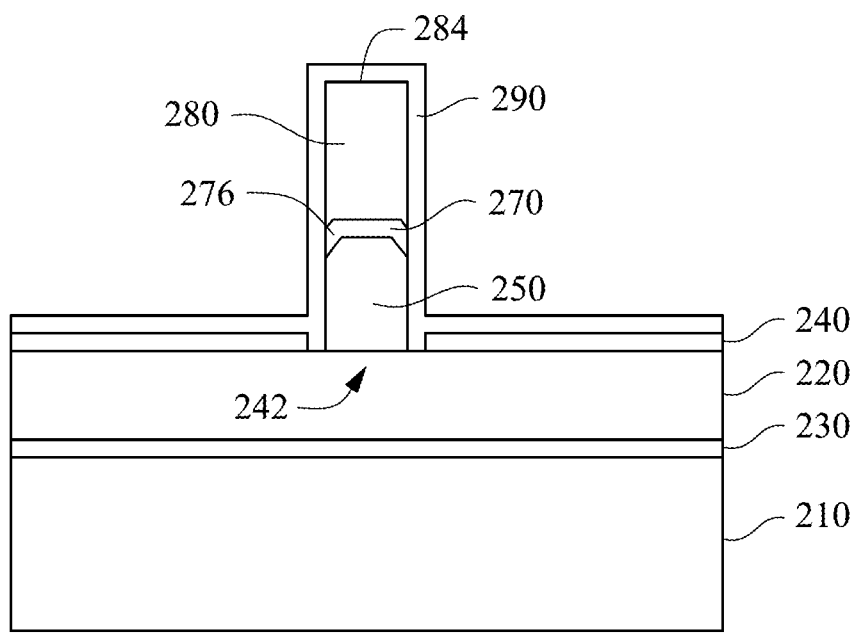
Figure 2K:
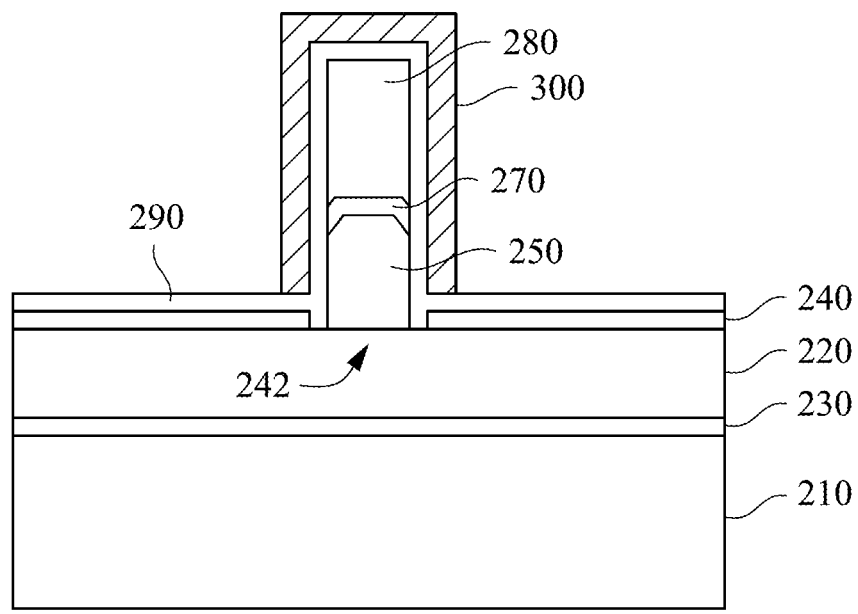

In example operation 170, with references also to FIGS. 2J and 2K, a gate structure is formed adjacent, or more specifically surrounding, InN layer 270. As shown in FIG. 2J, a high dielectric constant (high-K) dielectric layer 290 is formed surrounding the heterojunction structure of second nanowire GaN layer 250, InN layer 270 and third nanowire GaN layer 280. High-K dielectric layer 290 also fills unfilled portions of aperture 242. In an embodiment, depending on the material used in mask layer 240, high-K dielectric layer 290 may also extend over mask layer 240, and/or may be formed over top surface 284 of third nanowire GaN layer 280.

High-K dielectric material may be selected from one or more of hafnium oxide (HfO$_2$), hafnium silicon oxide (HfSiO), hafnium silicon oxynitride (HfSiON), hafnium tantalum oxide (HMO), hafnium titanium oxide (HMO), hafnium zirconium oxide (HfArO), combinations thereof, and/or other suitable materials ZrO$_2$, Al$_2$O$_3$, LaO, TiO, Ta$_2$O$_5$, Y$_2$O$_3$, STO, BTO, BaZrO, HfZrO, HfLaO.

High-K dielectric layer 290 may be formed by atomic layer deposition (ALD) or other suitable technique. In accordance with embodiments described herein, high-K dielectric layer 290 includes a thickness ranging from about 5 to about 25 angstrom (Å) or other suitable thickness.

As shown in FIG. 2K, a conductive, e.g., metal, gate layer 300 is formed surrounding (wrap around) InN layer 270, outside of high-K dielectric layer 290. Metal gate layer 300 may also surround or wrap around partially second nanowire GaN layer 250 and third nanowire GaN layer 280. In an embodiment, metal gate layer 300 is tungsten (W) or titanium nitride (TiN). Other suitable materials for metal gate layer 300 may include ruthenium, palladium, platinum, tungsten, cobalt, nickel, and/or conductive metal oxides and other suitable P-type metal materials and may include hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable materials for N-type metal materials.

Metal gate layer 300 may be formed through sputtering or atomic layer deposition (ALD). A thickness of metal gate layer 300 ranges between about 1 nm to about 5 nm.

Figure 2L:
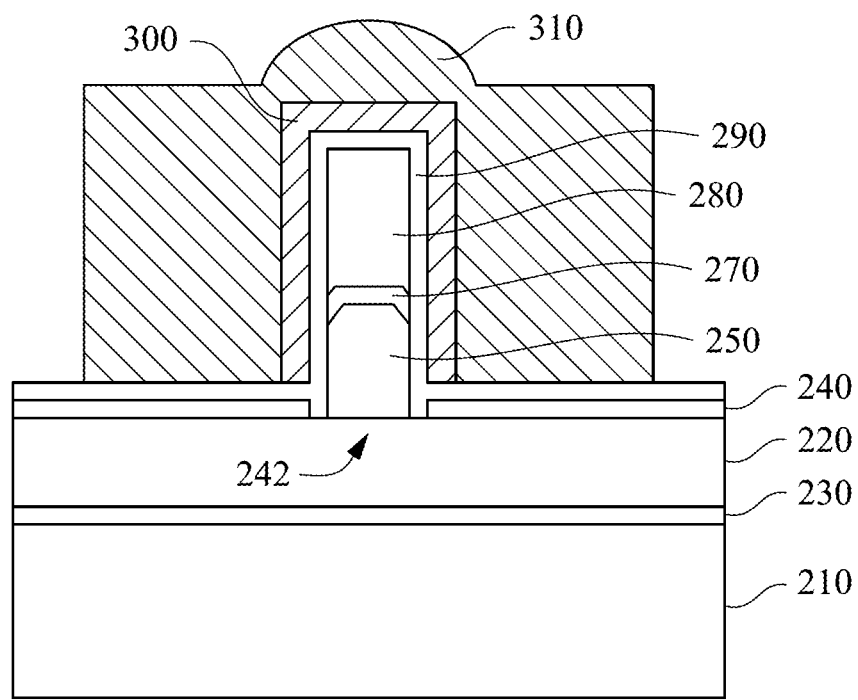

In example operation 180, with reference also to FIG. 2L, a conductive, e.g., metal, gate interconnect layer 310 is formed adjacent to metal gate layer 300 using any suitable processes.

Figure 2M:
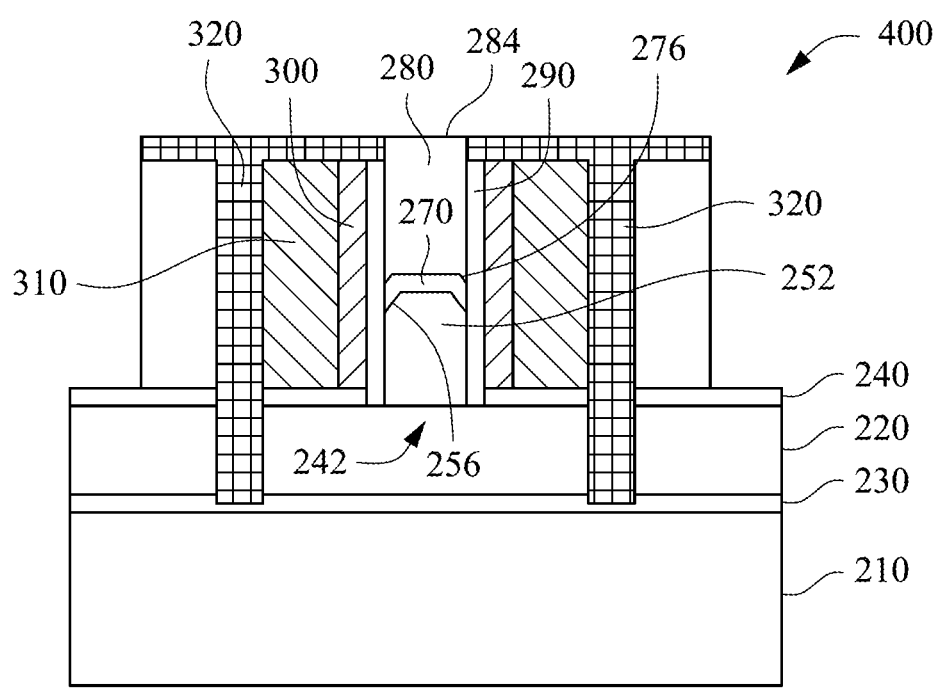

In example operation 190, with reference also to FIG. 2M, device separation processes are done to form a TFET device 400. The device separation processes may include a CMP process to remove extra gate interconnect metal layer 310, metal gate layer 300 and high-K dielectric layer 290 to expose top surface 284 of third nanowire GaN layer 280. The device separation processes may also include recessing metal gate layer 300 and gate interconnect metal layer 310 and forming an insulation layer 320 adjacent to and overlaying metal gate layer 300.

In an embodiment, insulation layer 320 extends downward beyond first nanowire GaN layer 220.

An example embodiment of a TFET device 400 in accordance with the present disclosure, as shown in FIG. 2M, includes first GaN layer 220 (a GaN base) and doped as P type, mask layer 240 over gallium nitride base 220 that includes aperture 242, second nanowire GaN layer 250 (a first nanowire source/drain region) overlaying GaN base 220, extending upward through aperture 242 and doped as P type same as GaN base 220, an intrinsic InN layer 270 (channel region) of one or more of InGaN or InN overlaying first nanowire source/drain region 250, third nanowire GaN layer 280 (second nanowire source/drain region) overlaying channel region 270 and doped as N type different than GaN base 220 and first nanowire source/drain region 250, and a gate structure (high-K dielectric layer 290 and metal gate layer 300) adjacent to channel region 270.

Another example embodiment of the TFET device 400 in accordance with the present disclosure, similar to that shown in FIG. 2M, includes first GaN layer 220 (a GaN base) and doped as N-type, mask layer 240 over gallium nitride substrate 220 that includes aperture 242, second nanowire GaN layer 250 (a first nanowire source/drain region) overlaying GaN base 220, extending upward through aperture 242 and doped as N-type same as GaN base 220, an intrinsic InN layer 270 (channel region) of one or more of InGaN or InN overlaying first nanowire source/drain region 250, third nanowire GaN layer 280 (second nanowire source/drain region) overlaying channel region 270 and doped as P-type different than GaN base 220 and first nanowire source/drain region 250, and a gate structure (high-K dielectric layer 290 and metal gate layer 300) adjacent to channel region 270.

In an embodiment, first nanowire source/drain region 250 includes a tapered top portion having six sloped surfaces 256. Sloped surfaces 256 each have a shape that is substantially the shape of an acute trapezoid or an acute triangle. Channel region 270 also includes six sloped segments 276. Second source/drain region of nanowire GaN 280 includes a top surface 284 that substantially overlaps the whole upper portion thereof and includes no sloped surfaces.

Insulation layer 320 extends downward toward substrate 210 and beyond GaN base 220. Insulation layer 320 is adjacent to metal gate layer 300 by the side thereof and overlays metal gate layer 300 from the top thereof.

Top surface 284 of second source/drain region 280 of nanowire GaN is exposed from insulation layer 320.

GaN base 220, first source/drain region 250 of nanowire GaN, and second source/drain region 280 of nanowire GaN are formed in the Ga polar orientation of GaN.

Similar vertical TFET structures of P-I-N heterojunctions may be formed using GaN grown in the N polar.

The foregoing outlines features of several embodiments so that those skilled in the art may better understand the aspects of the present description. Those skilled in the art should appreciate that they may readily use the present description as a basis for designing or modifying other processes and structures for carrying out the same purposes and/or achieving the same advantages of the embodiments introduced herein. Those skilled in the art should also realize that such equivalent constructions do not depart from the spirit and scope of the present description, and that they may make various changes, substitutions, and alterations herein without departing from the spirit and scope of the present description.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The present disclosure may be further appreciated with the description of the following embodiments:

In a structure embodiment, a structure include a substrate, a first gallium nitride layer in gallium polar over the substrate, a mask layer over the first gallium nitride layer, which includes an aperture, a second gallium nitride layer in gallium polar overlaying the first gallium nitride layer through the aperture, a layer of one or more of indium gallium nitride or indium nitride overlaying the second gallium nitride layer, and a third gallium nitride layer in gallium polar overlaying the layer of one or more of indium gallium nitride or indium nitride. The second gallium nitride layer has six sloped surfaces. The third gallium nitride layer has a substantially flat upper surface.

In tunnel FET device embodiment, a TFET device includes a gallium nitride base, a first nanowire source/drain region of gallium nitride overlaying the gallium nitride base, a channel region of a III-V semiconductor material different from GaN and overlaying the first nanowire source/drain region of gallium nitride, a second nanowire source/drain region of gallium nitride overlaying the channel region, and a gate structure adjacent to the channel region.

A method embodiment receives a wafer, which includes a first gallium nitride layer over a substrate. The first gallium nitride layer includes a first impurity of a first electronic conductivity type. A second nanowire gallium nitride layer is formed over the first gallium nitride layer by selective area growth. The second nanowire gallium nitride layer is formed with an impurity of the first electronic conductivity type same as the first nanowire gallium nitride layer. A layer of one or more of indium nitride or indium gallium nitride is formed over the second gallium nitride layer. A third nanowire gallium nitride layer is formed over the layer of one or more of indium nitride or indium gallium nitride. The third nanowire gallium nitride layer includes a third impurity of a second different electronic conductivity type. A sidewall of the second nanowire gallium nitride layer is exposed by removing a side portion of the third gallium nitride layer and a side portion of the layer of one of more of indium nitride or indium gallium nitride. A gate structure is formed adjacent to the layer of one or more of indium nitride or indium gallium nitride.

What is claimed is:

1. A method, comprising:
   forming a mask layer over a substrate;
   forming an opening in the mask layer;
   forming a first nanowire structure of gallium nitride over the substrate and from the opening in the mask layer, the first nanowire structure having a sloped upper surface;
   forming an intermediate layer of a III-V semiconductor material different from gallium nitride overlaying the first nanowire structure, a lower surface of the intermediate layer following the sloped upper surface of the first nanowire structure region; and
   forming a second nanowire structure of gallium nitride overlaying the intermediate layer,
   wherein the forming the first nanowire structure includes forming the first nanowire structure having the sloped upper surface of six sloped surface portions.

2. The method of claim 1, wherein the intermediate layer is one or more of indium nitride or indium gallium nitride.

3. The method of claim 1, wherein the forming the intermediate layer includes:
   forming a layer of the III-V semiconductor material on the first nanowire structure; and
   patterning the layer of the III-V semiconductor material such that an edge surface of the layer of the III-V semiconductor material is coplanar with a sidewall surface of the first nanowire structure.

4. The method of claim 3, wherein the forming the second nanowire structure includes:
   forming a layer of gallium nitride on the intermediate layer; and
   patterning the layer of gallium nitride in a same patterning procedure as the patterning the layer of the III-V semiconductor material.

5. The method of claim 1 wherein a sloped surface portion of the six sloped surface portions has a shape, the shape being substantially that of an acute trapezoid.

6. The method of claim 1, wherein a sloped surface portion of the six sloped surface portions has a shape, the shape being substantially that of an acute triangle.

7. The method of claim 1, wherein the forming the intermediate layer of the III-V semiconductor material includes forming the intermediate layer having a substantially hexagon top surface.

8. A method, comprising:
   forming a first gallium nitride layer in gallium polar over a substrate;
   forming a mask layer over the first gallium nitride layer;
   forming an aperture in the mask layer;
   forming a second gallium nitride layer in gallium polar overlaying the first gallium nitride layer through the aperture, the second gallium nitride layer having a sloped upper surface;
   forming an intermediate layer of a III-V semiconductor material different from gallium nitride overlaying the second gallium nitride layer, a lower surface of the intermediate layer following the sloped upper surface of the second gallium nitride layer;
   forming a third gallium nitride layer in gallium polar overlaying the intermediate layer, the third gallium nitride layer having a substantially flat upper surface; and
   removing side portions of one or more of the intermediate layer or the third gallium nitride layer.

9. The method of claim 8, wherein the forming the second gallium nitride layer includes forming the second gallium nitride layer having the sloped upper surface of six sloped surface portions.

10. The method of claim 9 wherein a sloped surface portion of the six sloped surface portions has a shape, the shape being substantially that of an acute trapezoid.

11. The method of claim 9, wherein a sloped surface portion of the six sloped surface portions has a shape, the shape being substantially that of an acute triangle.

12. The method of claim 8, wherein forming the intermediate layer of the III-V semiconductor material includes forming the intermediate layer having a substantially hexagon top surface.

13. The method of claim 8, wherein the forming the first gallium nitride layer includes doping the first gallium nitride layer with a first type of electronic conductivity; and
   wherein the forming the second gallium nitride layer includes doping the second gallium nitride layer with the first type of electronic conductivity.

14. The method of claim 13, wherein the forming the third gallium nitride layer includes doping the third gallium nitride layer with a second type of electronic conductivity that is different from the first type of electronic conductivity.

15. The method of claim 8, further comprising forming an aluminum nitride layer between the substrate and the first gallium nitride layer.

16. The method of claim 1, wherein the intermediate layer is one or more of indium nitride or indium gallium nitride.

17. The method of claim 8, further comprising forming a gate structure surrounding the intermediate layer after the removing the side portions of the one or more of the intermediate layer or the third gallium nitride layer.

18. A method, comprising:
  forming a vertical nanowire stack over a substrate, the vertical nanowire stack including:
    a first nanowire source/drain region of gallium nitride in gallium polar, the first nanowire source/drain region including a sloped top surface;
    an intermediate region of a III-V semiconductor material different from gallium nitride overlaying the first nanowire source/drain region;
    a second nanowire source/drain region of gallium nitride in gallium polar overlaying the intermediate region; and
  forming a gate structure adjacent to the intermediate region,
  wherein the forming the vertical nanowire stack includes:
    forming a mask layer over the substrate;
    forming an opening in the mask layer; and
    growing the first nanowire source/drain region of gallium nitride from the opening in the mask layer.

19. The method of claim 18, wherein the sloped top surface includes six sloped surface portions.

20. A method, comprising:
  forming a mask layer over a substrate;
  forming an opening in the mask layer;
  forming a first nanowire structure of gallium nitride over the substrate and from the opening in the mask layer, the first nanowire structure having a sloped upper surface;
  forming an intermediate layer of a III-V semiconductor material different from gallium nitride overlaying the first nanowire structure, a lower surface of the intermediate layer following the sloped upper surface of the first nanowire structure region; and
  forming a second nanowire structure of gallium nitride overlaying the intermediate layer,
  wherein the forming the intermediate layer of the III-V semiconductor material includes forming the intermediate layer having a substantially hexagon top surface.

* * * * *